(12) United States Patent
Kuramori

(10) Patent No.: US 7,460,409 B2
(45) Date of Patent: Dec. 2, 2008

(54) ELECTRICALLY WRITABLE NONVOLATILE MEMORY

(75) Inventor: Bunsho Kuramori, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 219 days.

(21) Appl. No.: 11/584,589

(22) Filed: Oct. 23, 2006

(65) Prior Publication Data

US 2007/0121379 A1    May 31, 2007

(30) Foreign Application Priority Data

Nov. 30, 2005    (JP) .............................. 2005-345844

(51) Int. Cl.
*G11C 11/34* (2006.01)
(52) U.S. Cl. ................ 365/185.25; 365/185.2
(58) Field of Classification Search ............ 365/185.25, 365/185.2, 203, 210
See application file for complete search history.

(56) References Cited

U.S. PATENT DOCUMENTS

| | | | | |
|---|---|---|---|---|
| 5,132,933 A | | 7/1992 | Schreck et al. | |
| 5,754,475 A | * | 5/1998 | Bill et al. | 365/185.25 |
| 6,191,979 B1 | * | 2/2001 | Uekubo | 365/185.25 |
| 6,424,572 B2 | * | 7/2002 | Sano | 365/185.25 |
| 6,480,419 B2 | * | 11/2002 | Lee | 365/185.18 |
| 2005/0024966 A1 | | 2/2005 | Oyama | |

* cited by examiner

*Primary Examiner*—Anh Phung
(74) *Attorney, Agent, or Firm*—Studebaker & Brackett PC; Donald R. Studebaker

(57) ABSTRACT

A nonvolatile memory includes a memory cell array in which a plurality of memory cells are connected to a plurality of wordlines and a plurality of bitlines respectively intersecting at a right angle with the plurality of wordlines; a selector for selecting one of the bitlines which is connected to first one of the memory cells in which actual data is stored; and a transfer circuit for connecting with a reference bitline which is connected to second one of the memory cells in which a reference level is stored. The nonvolatile memory further includes an amplifier section, connected to the selector and the transfer circuit, for reading out and amplifying levels of the bitline and the reference bitline and comparing the actual data with the reference level; and a charger for charging the bitline selected by the selector.

12 Claims, 11 Drawing Sheets

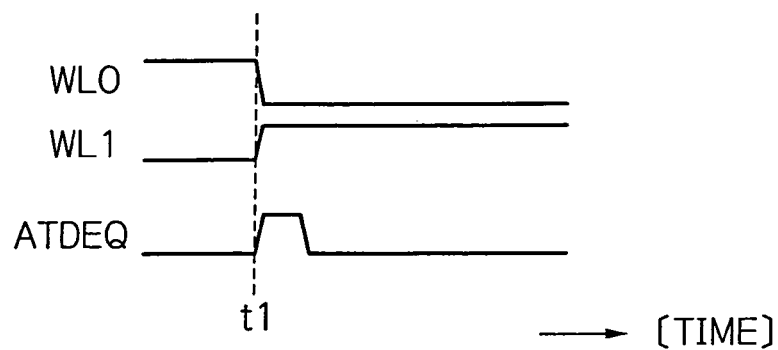
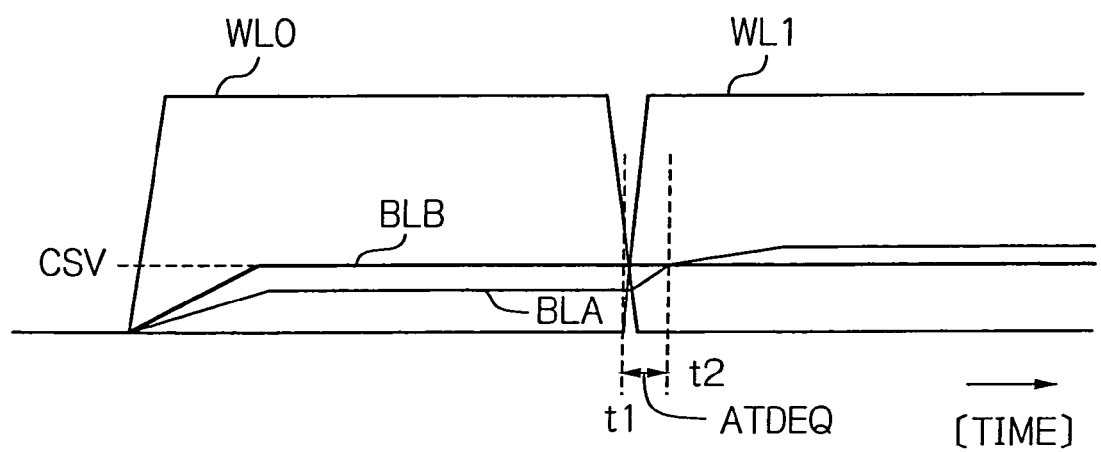

ELECTRICALLY WRITABLE NONVOLATILE MEMORY

BACKGROUND OF THE INVENTION

1. Field of the Invention

The present invention relates to an electrically writable nonvolatile memory.

2. Description of the Background Art

Conventionally, in electrically writable nonvolatile memories, for example, as disclosed by U.S. Patent Application Publication No. 2005/0024966 A1 to Oyama and U.S. Pat. No. 5,132,933 to Schreck et al., a plurality of memory cells are connected to wordlines (WLs) and bitlines (BLs) to form a memory cell array, in which a bitline (BL) connected to a memory cell to be read is connected through a cell selector to a cell-reading amplifier, and a current of the selected memory cell is compared with a current of a reference memory cell to read-out data.

In this case, the cell-reading amplifier employs a cell source voltage (CSV) level as a reference voltage, and a voltage of a bitline in a stable condition is approximately equal to the cell source voltage.

In the conventional systems, when switching memory cells which are to be read, memory cells that are connected to a reference bitline are always in the same direction. Therefore, there is no large change in the amount of current flowing through the reference bitline. However, memory cells that are to be read include both a zero-read cell for reading a bit "zero" and a one-read cell for reading a bit "one". Because of this, when a zero-read cell is read after a one-read cell is read, current flows until the bitline is charged to some extent, and therefore, it takes time to determine whether a bit "zero" has been read. This requires, for example, 70 nanoseconds, resulting in an access delay.

SUMMARY OF THE INVENTION

It is therefore an object of the present invention to provide a nonvolatile memory that is capable of reducing an access delay.

In accordance with the present invention, there is provided a nonvolatile memory for storing data electrically writably, comprising: a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; and a charger for charging the bitline selected by the selector.

Further in accordance with the present invention, there is also provided a nonvolatile memory for storing data electrically writably, comprising: a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; and a discharger for discharging the reference bitline.

Still further in accordance with the present invention, there is also provided a nonvolatile memory for storing data electrically writably, comprising: a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; a charger for charging the bitline selected by the selector; and a discharger for discharging the reference bitline.

According to the present invention, the nonvolatile memory is capable of reducing an access delay by controlling the potential of a bitline when switching wordlines.

BRIEF DESCRIPTION OF THE DRAWINGS

The objects and features of the present invention will become more apparent from consideration of the following detailed description taken in conjunction with the accompanying drawings in which:

FIG. 10 is a timing chart, like FIG. 4, showing how word lines are switched when the current-supply circuit shown in FIG. 9 is used;

FIG. 11 is a timing chart, like FIG. 5, showing how the potential levels of bitlines are varied when the current-supply circuit shown in FIG. 9 is used;

DESCRIPTION OF THE PREFERRED EMBODIMENTS

Figure 1:
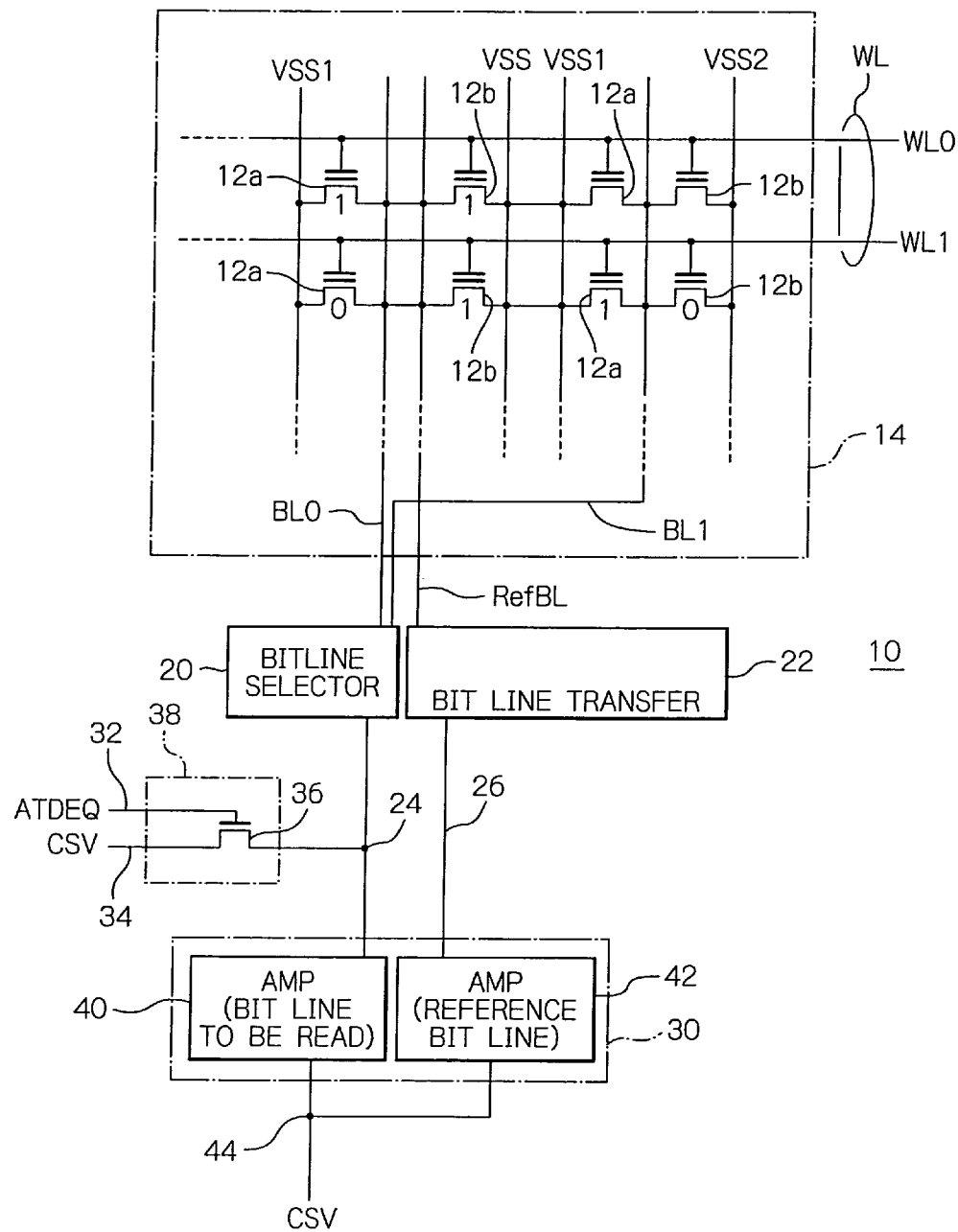
FIG. 1 is a schematic block diagram showing an embodiment of an electrically writable nonvolatile memory to which the present invention is applied.

Preferred embodiments of an electrically writable nonvolatile memory according to the present invention will be described with reference to the accompanying drawings. Referring first to FIG. 1, an illustrative embodiment of the nonvolatile memory according to the present invention is directed to a nonvolatile memory 10 fabricated in the form of semiconductor integrated circuit. The nonvolatile memory 10 includes a memory cell array 14 in which a plurality of memory cells 12a for storing actual data and a plurality of memory cells 12b for storing a reference level are respectively connected to wordlines (WL0, WL1, . . . ) and bitlines (BL0, BL1, . . . ); a bitline selector 20 for selecting a bitline; a bitline transfer circuit 22 connected to a reference memory cell 12b through a reference bitline (RefBL); and an amplifier section 30 connected to the bitline selector 20 and bitline transfer circuit 22 through connecting lines 24, 26.

The nonvolatile memory 10 further includes a current-supply circuit 38 connected to the connecting line 24. The current-supply circuit 38 has a transistor 36 which charges, in response to a signal (ATDEQ: Address Transition Detect Equalizer) 32 from an equalizer, not shown, which detects an address transition, a bitline by supplying a cell source voltage (CSV) 34 to the node of the connecting line 24. Note that parts not directly relevant to understanding the present invention will not be shown for simplicity. Signals are designated with reference numerals for connections on which they are conveyed.

The amplifier section 30 has a first amplifier 40 for amplifying and detecting a current flowing through a bitline connected to a memory cell 12a which is to be read, and a second amplifier 42 for amplifying and detecting a current flowing through a reference bitline connected to reference memory cells 12b. The first and second amplifiers 40, 42 are supplied with the cell source voltage (CSV) which is a reference voltage. Although not shown, the nonvolatile memory 10 further includes an address selector for selecting a wordline (WL), a write circuit for writing data, and so forth.

Figure 2:
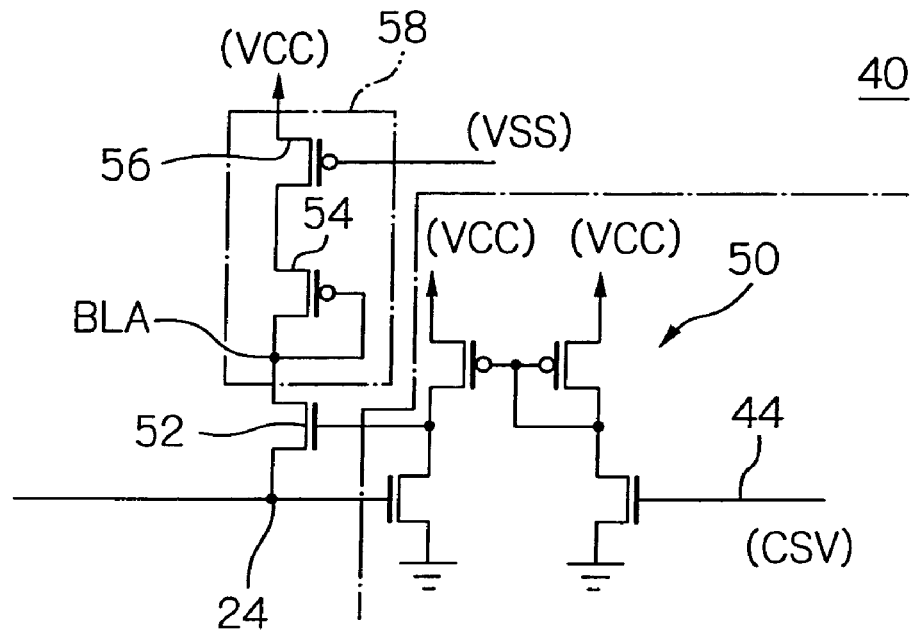
FIGS. 2 and 3 are schematic circuit diagrams showing an example of a first and a second amplifier used in the nonvolatile memory shown in FIG. 1, respectively.
Figure 3:
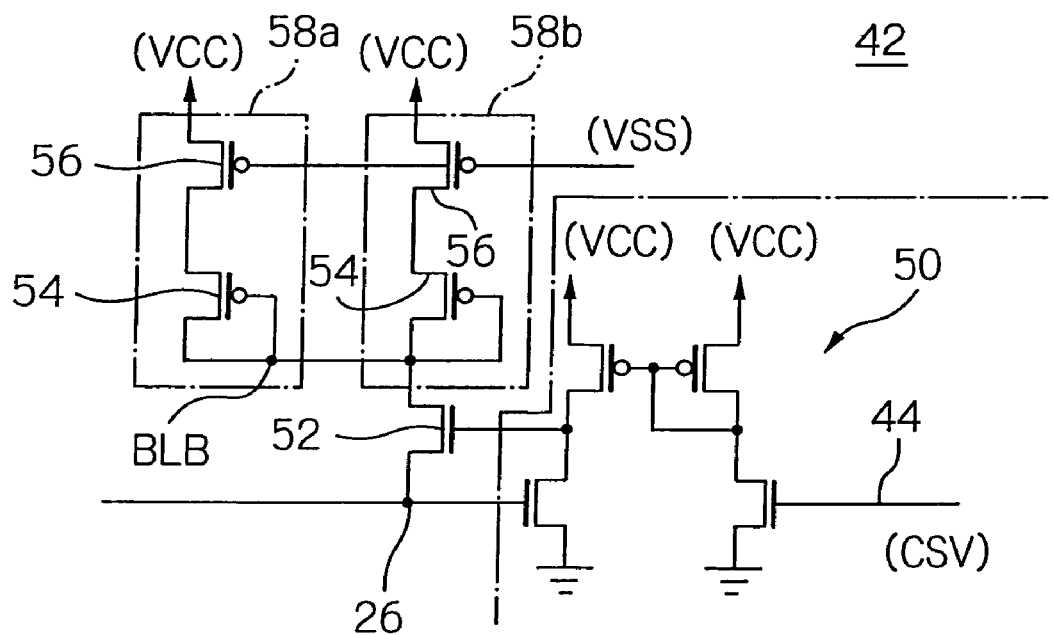

The major components of the first amplifier 40 in the amplifier section 30 are shown in FIG. 2, while those of the second amplifier 42 are shown in FIG. 3. As shown in FIG. 2, the first amplifier 40 functions as a current mirror 50 having a pair of P-channel MOS (Metal-Oxide Semiconductor) transistors and a pair of N-channel MOS transistors, with the instant embodiment. The current mirror 50 is connected to an N-channel transistor 52. The N-channel transistor 52 is connected to the node BLA of a circuit 58 comprising two P-channel transistors 54 and 56 connected in series to each other, and is connected to the bitline selector 20 through the connecting line 24.

The second amplifier 42 shown in FIG. 3, as with the first amplifier 40, functions as a current mirror 50 having a pair P-channel transistors and a pair of N-channel transistors. The current mirror 50 is connected to an N-channel transistor 52. The N-channel transistor 52 is connected to the nodes BLB of two P-channel transistors 54 and 56 connected in series, and is connected to the bitline transfer circuit 22 through the connecting line 26. Thus, the second amplifier 42 is constructed such that the circuits 58a and 58b, which are the same as the circuit 58 shown in FIG. 2, are connected in parallel to each other.

Returning again to FIG. 1, the memory cell array 14 is constructed so that a plurality of wordlines (WL0, WL1, . . . ) having the floating gates of the memory cells 12a and 12b connected thereto intersect at a substantially right angle or perpendicularly with a plurality of bitlines (BL0, BL1, . . . ) having the sources or drains of the memory cells 12a and 12b connected thereto. The bitline (BL0) is connected to the bitline selector 20, while a reference bitline (RefBL) is connected to the bitline transfer circuit 22 which transfers a bitline level. An increase in the memory capacity of the memory cell array 14 causes parasitic capacitances to respectively occur on these bitlines (BL0, BL1, . . . ). For clarity, in FIG. 1, some of the memory cells 12a and 12b of the memory cell array 14 are shown and the remaining memory cells are not shown.

Figure 4:
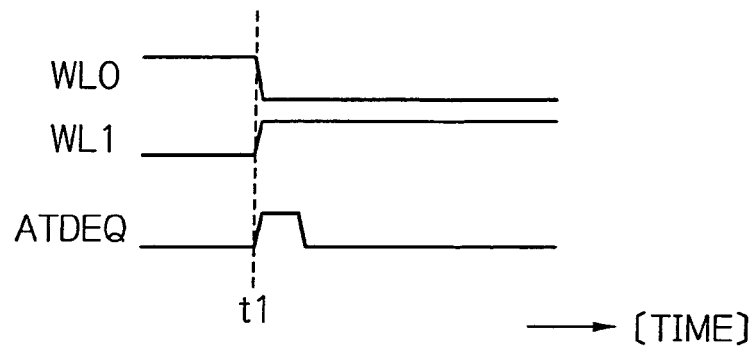
FIG. 4 is a timing chart showing how wordlines are switched when a current-supply circuit shown in FIG. 1 is used.

The current-supply circuit 38 having the bitline selector 20 connected thereto through the connecting line 24 is turned on in response to a signal ATDEQ which is caused to occur, for example, when the wordline (WL0) and the wordline (WL1) are switched as shown in FIG. 4, i.e. when memory cells to be read are switched (time t1), and applies a cell source voltage (CSV) to the connecting line 24 through the transistor 34. The connecting line 24 is connected with either of the bitlines BL0 and BL1 which is selected in the bitline selector 20, so that a current for charging the bitline BL0 or BL1 being connected is supplied along with a current from the first amplifier 40. This can raise the potential on the selected bitline quickly, including charging of the parasitic capacitance of the selected bitline. In other word, the positive-going of the potential on a bitline in switching wordlines is speeded up, whereby an access delay is prevented.

Figure 5:
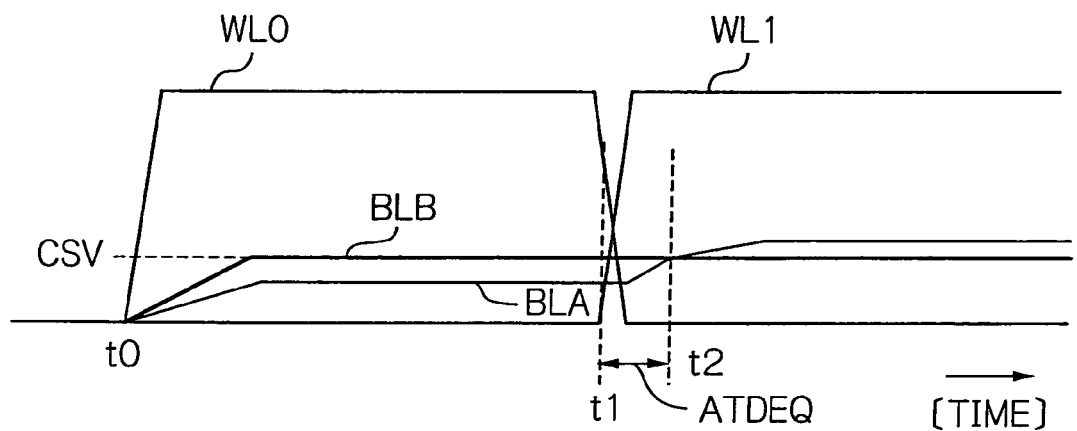
FIG. 5 is a timing chart showing how the potential levels of bitlines are varied when the current-supply circuit shown in FIG. 1 is used.

An example of the switching operation is shown in FIG. 5, which shows the potential levels of the nodes BLA and BLB of the first and second amplifiers 40 and 42 in switching wordlines, and the occurrence period of the signal ATDEQ. At the time of the selection of the wordline WL0 (time t0 to t1), the node BLB of the second amplifier 42 is maintained at the cell source voltage (CSV), while the node BLA of the first amplifier 40 is maintained at a voltage lower than the cell source voltage (CSV). If the signal ATDEQ occurs and the wordline WL1 is selected, the potential of the node BLA is raised to the cell source voltage (CSV) (time t2) and maintained at a potential higher than the cell source voltage (CSV). Thus, a bitline connected to a selected memory cell which is to be read is forcibly charged to the CSV level which is the reference voltage of the amplifier section 30, so that reading of a bit "zero" is speeded up.

Figure 6:
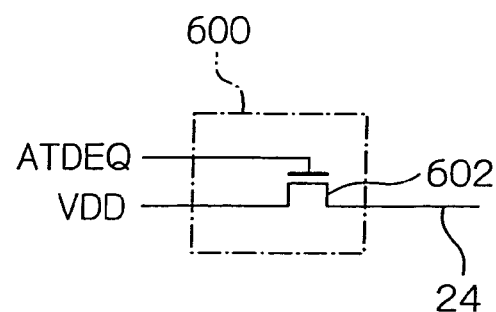
FIG. 6 is a schematic circuit diagram showing another example of the current-supply circuit used in the nonvolatile memory of FIG. 1.
Figure 7:
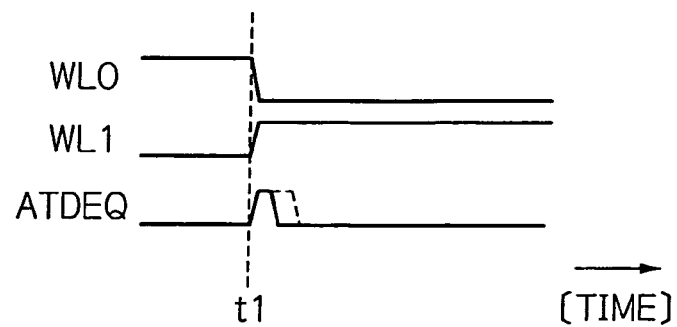
FIG. 7 is a timing chart, like FIG. 4, showing how wordlines are switched when the current-supply circuit shown in FIG. 6 is used.
Figure 8:
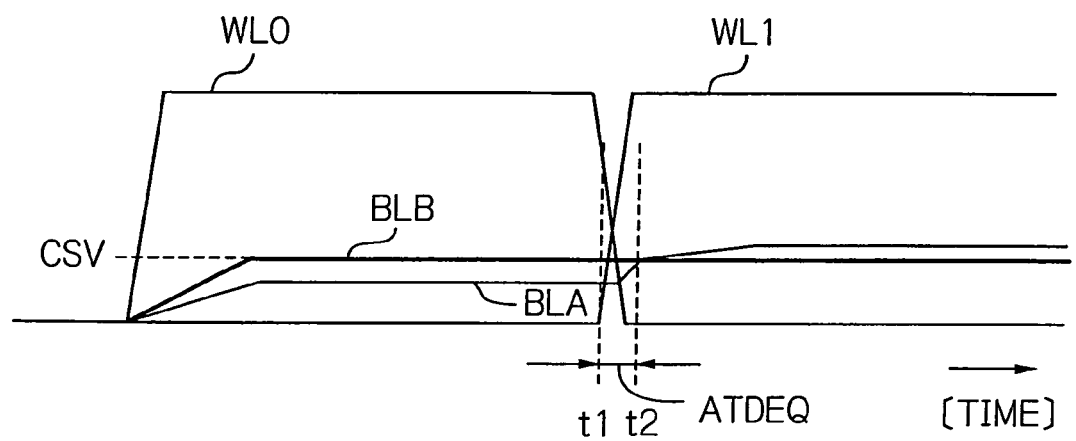
FIG. 8 is a timing chart, like FIG. 5, showing how the potential levels of bitlines are varied when the current-supply circuit shown in FIG. 6 is used.

In place of the current-supply circuit 38 to which the cell source voltage (CSV) is applied, a current-supply circuit 600 shown in FIG. 6 may be employed as an example. As shown in FIG. 7, the current-supply circuit 600 is turned on in response to a signal ATDEQ that occurs when switching the wordlines WL0 and WL1, and applies a power-supply voltage VDD to the connecting line 24 through a transistor 602. In this case, the significant occurrence period of the signal ATDEQ which is its pulse width may be set shorter than that in the case where the current-supply circuit 38 shown in FIG. 1 is used. That is, as shown in FIG. 8, the time (t1 to t2) required for the node BLA to reach the cell source voltage (CSV) is shortened.

Thus, in the example shown in FIG. 6, by adjusting the pulse width of the signal ATDEQ, and turning on and off the current-supply circuit 600 with the power-supply voltage VDD, a bitline selected is charged to a level near the cell source voltage (CSV), so that an access delay can be reduced.

Figure 9:
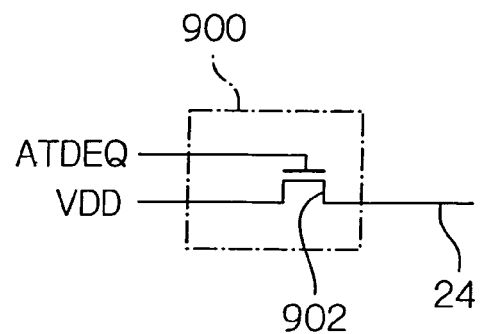
FIG. 9 is a schematic circuit diagram, like FIG. 6, showing still another example of the current-supply circuit used in the nonvolatile memory of FIG. 1.

The current-supply circuit 600 may also be replaced with a current-supply circuit 900 shown in FIG. 9. The current-supply circuit 900 has a transistor 902 whose channel width-to-length (W/L) ratio is smaller, i.e. the channel width is smaller and the channel length is longer. Even in this example, as shown in FIG. 10, the current-supply circuit 900 is turned on in response to a signal ATDEQ and applies a power-supply voltage VDD to the connecting line 24 through the transistor 902 whose drive ability is great. As a result, as shown in FIG. 11, the time (t1 to t2) required for the node BLA to reach the cell source voltage (CSV) can be shortened. Even in this example, as with the case shown in FIG. 7, after the pulse width of the signal ATDEQ has been adjusted, it may be input to the current-supply circuit 900.

Figure 12:
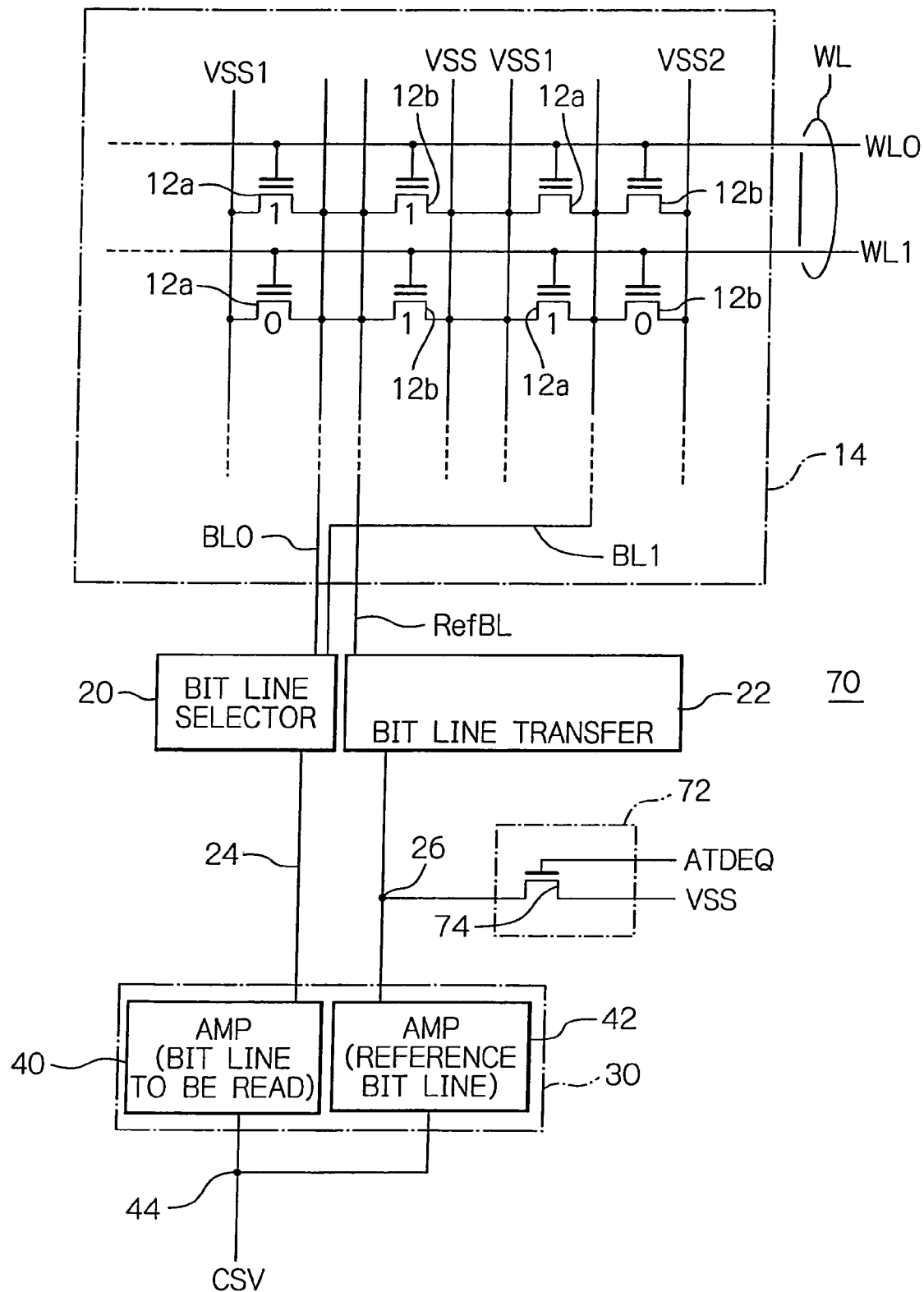
FIG. 12 is a schematic block diagram, like FIG. 1, showing an alternative embodiment of the nonvolatile memory.

Next, an alternative embodiment of the nonvolatile memory will be described with reference to FIG. 12. The nonvolatile memory 70 in the alternative embodiment may be identical with the illustrative embodiment shown in and described with reference to FIG. 1 except that instead of the current-supply circuit 36 of FIG. 1, a current-supply circuit 72 is connected to a connecting line 26 through which a bitline transfer circuit 22 and a second amplifier 42 are connected. Because the other parts may be the same as those of FIG. 1, a description of the same parts will not be repeated.

Figure 13:
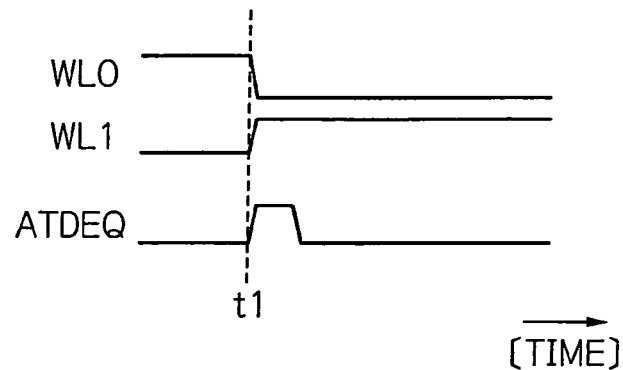
FIG. 13 is a timing chart, like FIG. 4, showing how word lines are switched when a current-supply circuit shown in FIG. 12 is used.

As shown in FIG. 13, the current-supply circuit 72 in the alternative embodiment operates in response to a signal ATDEQ that occurs when the wordlines WL0 and WL1 are switched so that memory cells to be read are switched, and applies a voltage VSS to the connecting line 26 through a transistor 74. Since the connecting line 26 is connected to a bitline selector 20 and a second amplifier 42, a current for forcibly discharging to the voltage VSS a reference bitline RefBL being connected is supplied along with a current to the second amplifier 42. This quickly reduces the potential of the reference bitline. That is to say, a rise in the potential of a bitline in switching wordlines is speeded up, whereby an access delay is prevented.

Figure 14:
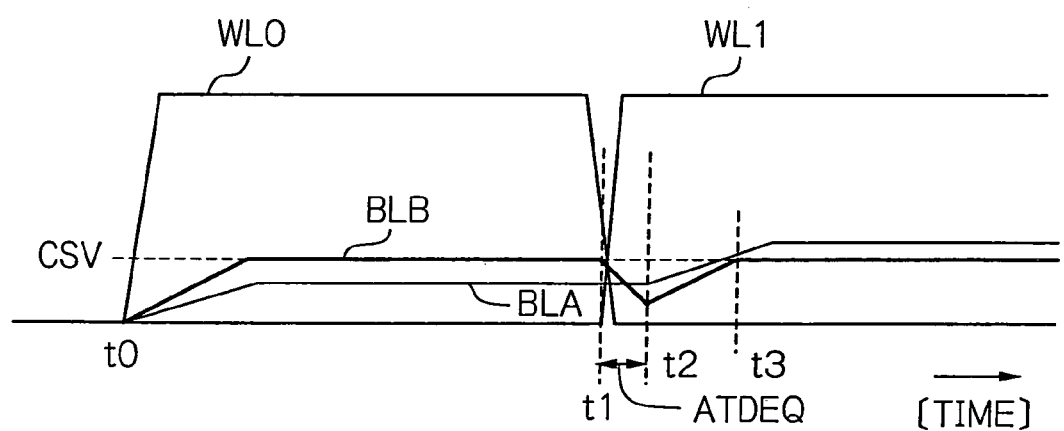
FIG. 14 is a timing chart, like FIG. 5, showing how the potential levels of bitlines are varied when the current-supply circuit shown in FIG. 12 is used.

By way of example, the switching operation is shown in FIG. 14, which shows the potential levels of the nodes BLA and BLB of the first and second amplifiers 40 and 42 in switching wordlines, and the occurrence period of the signal ATDEQ. At the time of the selection of the wordline WL0 (time t0 to t1), the node BLB of the second amplifier 42 is maintained at the cell source voltage (CSV), while the node BLA of the first amplifier 40 is maintained at a voltage lower than the cell source voltage (CSV). If the signal ATDEQ occurs and the wordline WL1 is selected, the node BLB is discharged and therefore the voltage thereof drops (time t1 to t2). After the stop of the occurrence of the signal ATDEQ, the voltage of the node BLB is restored to the cell source voltage (CSV) (time t2 to t3).

Thus, the signal ATDEQ is caused to occur when memory cells to be read are switched, and during this occurrence period, the reference bitline RefBL is forcibly discharged to a voltage VSS level. As a result, reading of a bit "zero" is speeded up. A voltage level to which the reference bitline is forcibly discharged is not limited to a ground level GND, but it may be a voltage lower than the cell source voltage (CSV).

Figure 15:
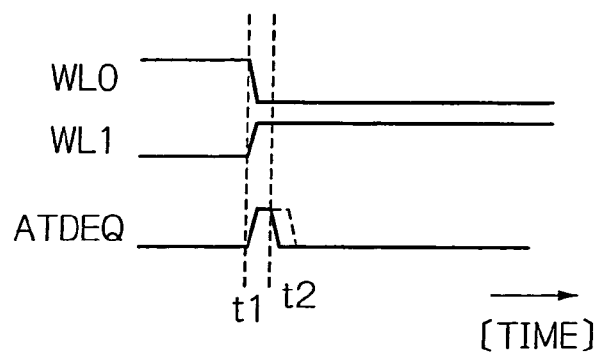
FIG. 15 is a timing chart showing how wordlines are switched when the pulse width of an address transition detection signal is adjusted.
Figure 16:
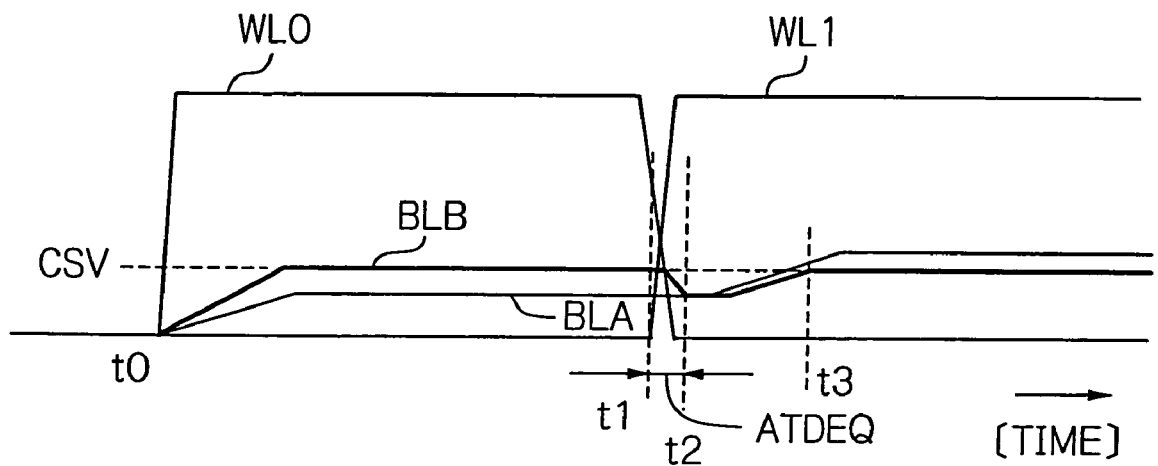
FIG. 16 is a timing chart showing how the potential levels of bitlines are varied when the pulse width of an address transition detection signal is adjusted.

In addition, as with the example shown in FIG. 7, by adjusting the pulse width of the signal ATDEQ, the pulse width may be varied between time t1 and time t2, as shown in FIG. 15. In this case, as shown in FIG. 16, if the signal ATDEQ is caused to occur when memory cells to be read are switched, the connecting line 26 on the reference side is discharged to a voltage adjusted by the pulse width or duration of the signal ATDEQ. Thus, the level of the reference bitline is reduced to an optimum value, whereby reading of a bit "zero" can be speeded up, and a delay in reading a bit "one" can be suppressed.

Figure 17:
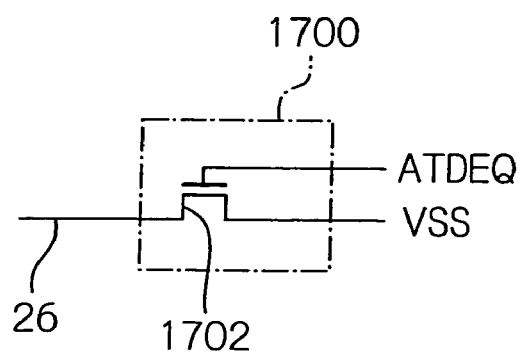
FIG. 17 is a schematic circuit diagram, like FIG. 6, showing another example of the current-supply circuit used in the nonvolatile memory of FIG. 12.
Figure 18:
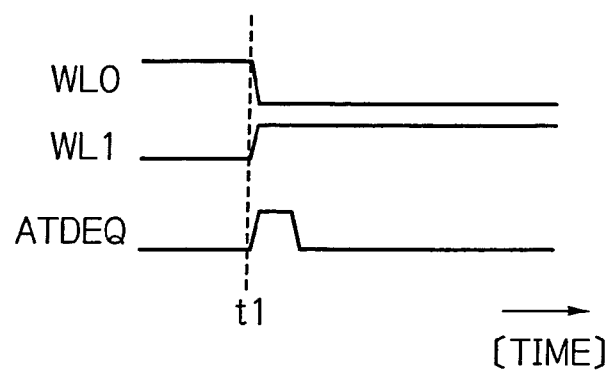
FIG. 18 is a timing chart, like FIG. 4, showing how wordlines are switched when the current-supply circuit shown in FIG. 17 is used.
Figure 19:
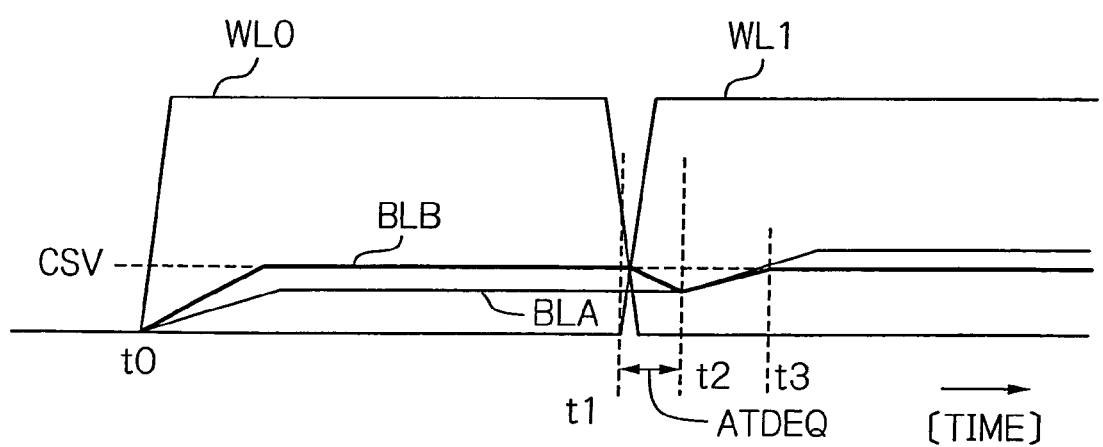
FIG. 19 is a timing chart, like FIG. 5, showing how the potential levels of bitlines are varied when the current-supply circuit shown in FIG. 17 is used.

The current-supply circuit 72 may further be replaced with a current-supply circuit 1700 shown in FIG. 17. The current-supply circuit 1700 has a transistor 1702 whose channel width-to-length (W/L) ratio is smaller, i.e. optimized. Even in this example, as shown in FIG. 18, the current-supply circuit 1700 is turned on in response to a signal ATDEQ and applies a voltage VSS to the connecting line 26 through the transistor 1702 whose drive ability is great, thereby reducing the potential of the reference bitline toward the voltage VSS. As a result, as shown in FIG. 19, the level of the reference bitline is reduced to an optimum value, whereby the time (t2 to t3) required for the node BLB to reach a cell source voltage (CSV) from time t2 can be shortened. Therefore, reading of a bit "zero" can be speeded up, and the occurrence of a delay in reading a bit "one" can be prevented. Even in this example, as in the case shown in FIG. 15, after the pulse width or duration of the signal ATDEQ has been adjusted, it maybe input to the current-supply circuit 1700.

Figure 20:
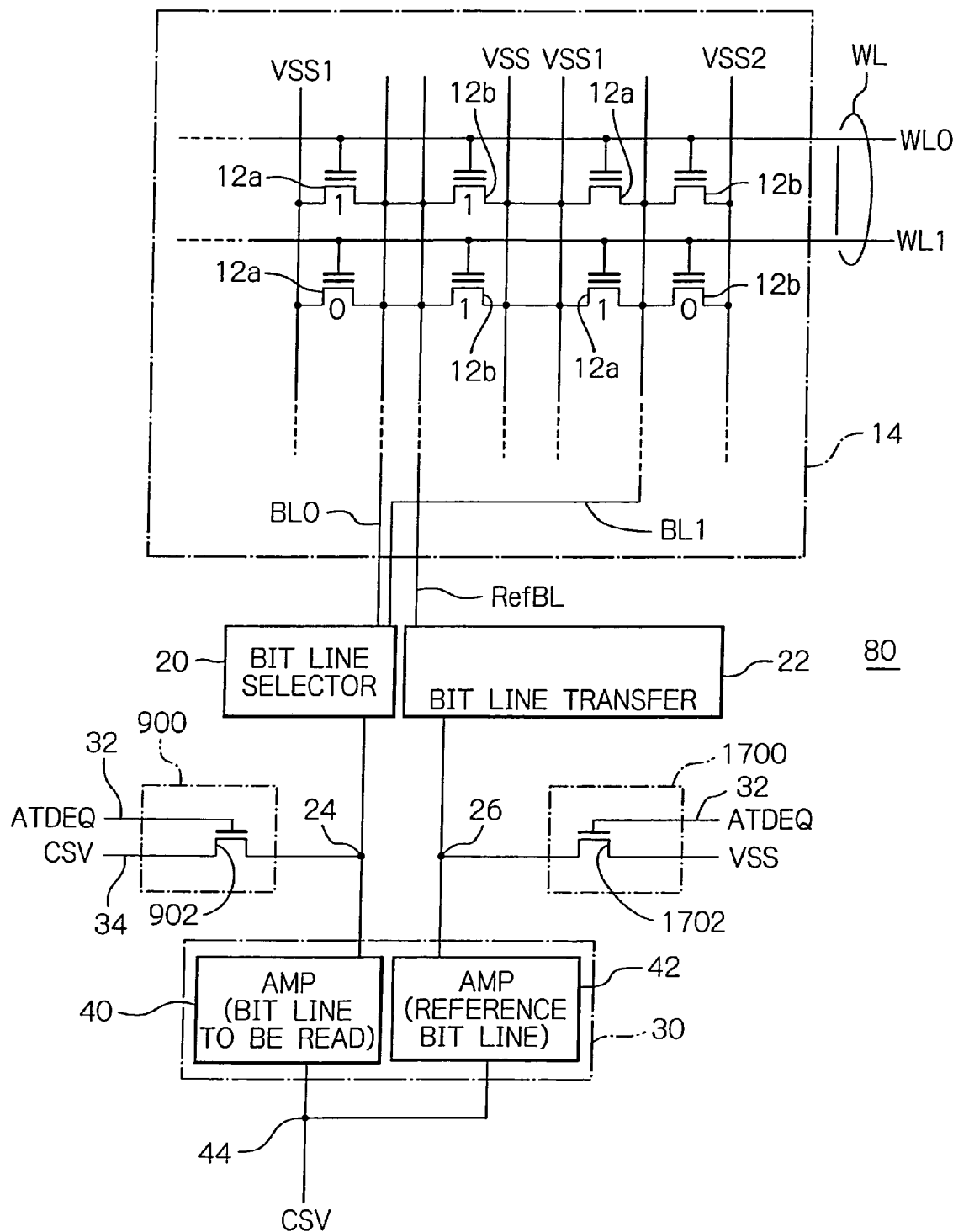
FIG. 20 is a schematic block diagram, like FIG. 1, showing another alternative embodiment of the nonvolatile memory.
Figure 21:
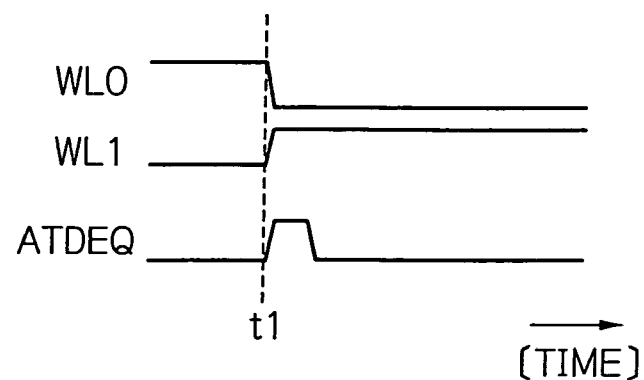
FIG. 21 is a timing chart, like FIG. 5, showing how wordlines are switched when a current-supply circuits shown in FIG. 20 are used.
Figure 22:
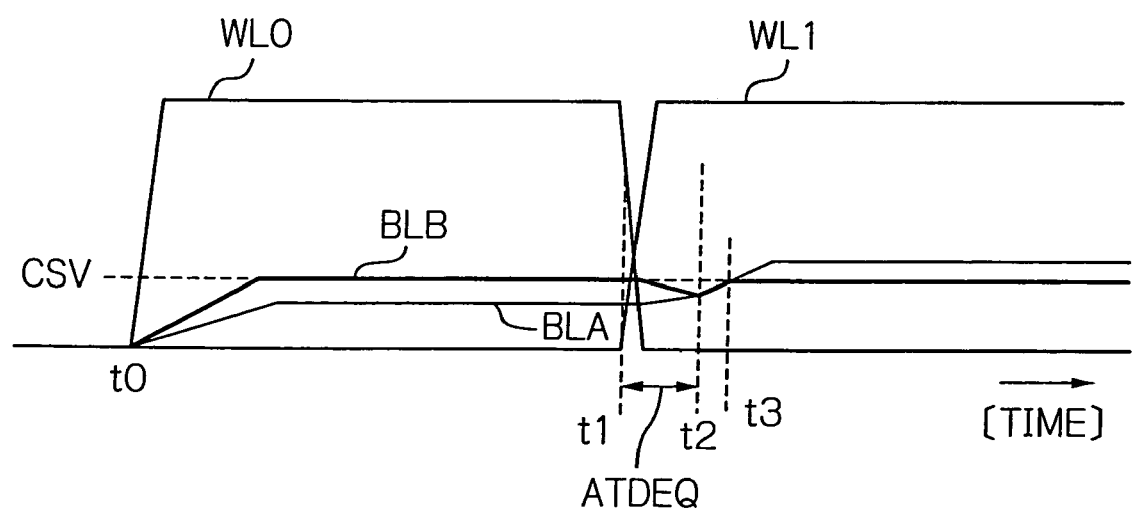
FIG. 22 is a timing chart, like FIG. 5, showing how the potential levels of bitlines are varied when the current-supply circuits shown in FIG. 20 are used.

Next, another alternative embodiment of the nonvolatile memory will be described with reference to FIG. 20. The nonvolatile memory 80 in the instant alternative embodiment is equipped with the current-supply circuits 900 and 1700 shown in FIGS. 9 and 17. The remaining parts may be the same as the embodiments shown in FIGS. 1 and 12. The nonvolatile memory 80 is equipped with both the current-supply circuits 900 and 1700, each of which controls the potential of a bitline in response to a signal ATDEQ. In the instant alternative embodiment, the pulse width of the signal ATDEQ may be optimized as shown in FIGS. 7 and 15. The dimensions of the transistors 902 and 1702 of the current-supply circuits 900 and 1700, respectively, are optimized depending upon the pulse width of the signal ATDEQ.

With the construction stated above, a bitline connected to a memory cell selected when wordlines WL are switched is charged quickly to an optimum value on the side of a cell source voltage (CSV), and the reference bitline RefBL is discharged to its optimum value on the side of a voltage VSS. With the construction which simultaneously performs the two controls, reading of a bit "zero" can be speeded up while suppressing a delay in reading a bit "one".

To overcome the problems described earlier, there is provided a method of reading a nonvolatile memory which stores data so as to be electrically writable. In the method, the nonvolatile memory includes a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; and a charger for charging the bitline selected by the selector. In the reading method, the bitline selected by the selector is charged when switching wordlines.

There is also provided another method of reading a nonvolatile memory which stores data so as to be electrically writable. In the method, the nonvolatile memory includes a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; and a discharger for discharging the reference bitline. In the reading method, the reference bitline is discharged when switching wordlines.

There is also provided still another method of reading a nonvolatile memory which stores data so as to be electrically writable. In the method, the nonvolatile memory includes a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; a charger for charging the bitline selected by the selector; and a discharger for discharging the reference bitline. In the reading method, the bitline selected by the selector is charged when switching wordlines, and the reference bitline is discharged when switching wordlines.

In accordance with one aspect of the present invention, there is provided a method of reading a nonvolatile memory which stores data so as to be electrically writable. In the method, the nonvolatile memory includes a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; and a charger for charging the bitline selected by the selector. The reading method comprises a step of charging the bitline selected by the selector when switching wordlines.

In accordance with another aspect of the present invention, there is provided another method of reading a nonvolatile memory which stores data so as to be electrically writable. In the method, the nonvolatile memory includes a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; and a discharger for discharging the reference bitline. The reading method comprises a step of discharging the reference bitline when switching wordlines.

In accordance with still another aspect of the present invention, there is provided still another method of reading a nonvolatile memory which stores data so as to be electrically writable. The nonvolatile memory includes a memory cell array in which a plurality of memory cells are connected to a plurality of wordlines and a plurality of bitlines respectively intersecting at a substantially right angle with the plurality of wordlines; a selector for selecting one of the bitlines which is connected to first one of the memory cells in which actual data is stored; a transfer circuit for connecting with a reference bitline which is connected to second one of the memory cells in which a reference level is stored; an amplifier section, connected to the selector and the transfer circuit, for reading out and amplifying levels of the bitline and the reference bitline and comparing the actual data with the reference level; a charger for charging the bitline selected by the selector; and a discharger for discharging the reference bitline. The reading method comprises a step of charging the bitline selected by the selector when switching wordlines, and a step of discharging the reference bitline when switching wordlines.

The entire disclosure of Japanese patent application No. 2005-345844 filed on Nov. 30, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A nonvolatile memory for storing data electrically writably, comprising:

a memory cell array in which a plurality of memory cells are connected to a plurality of wordlines and a plurality of bitlines respectively intersecting at a substantially right angle with said plurality of wordlines;

a selector for selecting one of said bitlines which is connected to first one of said memory cells in which actual data is stored;

a transfer circuit for connecting a reference bitline which is connected to second one of said memory cells in which a reference level is stored;

an amplifier section, connected to said selector and said transfer circuit, for reading out and amplifying levels of said bitline and said reference bitline and comparing the actual data with the reference level; and a charger for charging said bitline selected by said selector.

2. The nonvolatile memory in accordance with claim 1, wherein said charger is responsive to an address transition detection signal to charge said bitline selected by said selector.

3. The nonvolatile memory in accordance with claim 2, wherein said charger applies a cell source voltage to said bitline selected by said selector to charge said bitline.

4. The nonvolatile memory in accordance with claim 2, wherein said charger applies a reference voltage of said amplifier section to said bitline selected by said selector to charge said bitline.

5. The nonvolatile memory in accordance with claim 2, wherein said charger defines time for charging said bitline by a pulse width of the detection signal.

6. The nonvolatile memory in accordance with claim 2, wherein said charger comprises a transistor for supplying a voltage for charging said bitline, said transistor having a dimension defining the voltage.

7. A nonvolatile memory for storing data electrically writably, comprising:
- a memory cell array in which a plurality of memory cells are connected to a plurality of wordlines and a plurality of bitlines respectively intersecting at a substantially right angle with said plurality of wordlines;
- a selector for selecting one of said bitlines which is connected to first one of said memory cells in which actual data is stored;
- a transfer circuit for connecting with a reference bitline which is connected to second one of said memory cells in which a reference level is stored;
- an amplifier section, connected to said selector and said transfer circuit, for reading out and amplifying levels of said bitline and said reference bitline and comparing the actual data with the reference level; and
- a discharger for discharging said reference bitline.

8. The nonvolatile memory in accordance with claim 7, wherein said discharger is responsive to an address transition detection signal to discharge said reference bitline connected to said transfer circuit.

9. The nonvolatile memory in accordance with claim 7, wherein said discharger defines time for discharging said reference bitline by a pulse width of the detection signal.

10. The nonvolatile memory in accordance with claim 7, wherein said discharger comprises a transistor for discharging said reference bitline, said transistor having a dimension defining the voltage.

11. A nonvolatile memory for storing data electrically writably, comprising:
- a memory cell array in which a plurality of memory cells are connected to a plurality of wordlines and a plurality of bitlines respectively intersecting at a substantially right angle with said plurality of wordlines;
- a selector for selecting one of said bitlines which is connected to first one of said memory cells in which actual data is stored;
- a transfer circuit for connecting with a reference bitline which is connected to second one of said memory cells in which a reference level is stored;
- an amplifier section, connected to said selector and said transfer circuit, for reading out and amplifying levels of said bitline and said reference bitline and comparing the actual data with the reference level;
- a charger for charging said bitline selected by said selector; and
- a discharger for discharging said reference bitline.

12. The nonvolatile memory in accordance with claim 11, wherein
- said charger is responsive to an address transition detection signal to charge said bitline selected by said selector,
- said discharger being responsive to the detection signal to discharge said reference bitline.

* * * * *